(12) United States Patent
Thompson et al.

(10) Patent No.: US 6,452,443 B1
(45) Date of Patent: Sep. 17, 2002

(54) STABLE, LOW-NOISE BIMODAL AUDIO FILTER CIRCUIT

(75) Inventors: Timothy B. Thompson, Marlborough, MA (US); Howard A. Chamberlin, Jr., Waltham, MA (US)

(73) Assignee: Young Chang Company Limited (KR)

( * ) Notice: Subject to any disclaimer, the term of this patent is extended or adjusted under 35 U.S.C. 154(b) by 0 days.

(21) Appl. No.: 09/925,075

(22) Filed: Aug. 8, 2001

(51) Int. Cl.[7] .................................................. H03B 1/00
(52) U.S. Cl. ...................................................... 327/553
(58) Field of Search ................................ 327/552, 553, 327/558, 559, 561, 562, 563

(56) References Cited

U.S. PATENT DOCUMENTS 5,170,081 A * 12/1992 Adachi et al. .............. 327/524

* cited by examiner

Primary Examiner—Jeffrey Zweizig
(74) Attorney, Agent, or Firm—Cesari and McKenna, LLP

(57) ABSTRACT

An audio filter circuit is formed from a pair of cross-coupled, symmetric filters, each filter having a first stage comprising a single-pole, inverting low pass filter followed by a second stage comprising a two-pole, non-inverting Sallen-Key low pass filter. The circuit is readily switched between single-ended and double-ended output, while maintaining comparable noise and gain characteristics. The gain of the circuit is readily adjustable over a range of gains.

9 Claims, 1 Drawing Sheet

STABLE, LOW-NOISE BIMODAL AUDIO FILTER CIRCUIT

BACKGROUND OF THE INVENTION

1. Field of the Invention

The invention relates to audio filter circuits and comprises a stable, low noise audio filter circuit that is switchable to provide either single-ended or double-ended output.

2. Background Information

Audio filter circuits are frequently interposed between an audio source and audio output devices such as speakers, tape recorders, and the like. Such circuits provide certain desirable functionality and characteristics for the audio signal passing through them, such as gain control, noise reduction, and driving impedance matching, among other capabilities.

Digital to analog (DAC) converters are frequently used in sound generating, recording and processing systems to convert signals that are generated or processed in the digital domain into signals in the analog domain that are to be recorded on analog tape recorders or simply played through loudspeakers. The output of such converters frequently must be carefully filtered in order to remove undesirable high frequency components, both image and noise, without degrading the signal content. For example, some DAC's use a high-frequency, switched-capacitor, low pass filter to reduce high frequency noise at the output. Such a filter is economical, but nonetheless leaves a noise residue that can degrade the quality of a sound signal that subsequently is recorded or that is played through a loudspeaker.

Audio filter circuits may provide either single-ended or double-ended output, depending on the application. In circuits which provide both, it is difficult to provide flexible switching over a range of circuit gains while maintaining essentially the same noise and gain characteristics in the output circuit. Since noise from the DAC differential (double-ended, balanced) outputs is partially correlated, it can be reduced by subtraction using a differential amplifier.

SUMMARY OF THE INVENTION

Accordingly, it is an object of the invention to provide an improved audio filter circuit.

Further, it is an object of the invention to provide an improved audio filter circuit having a high signal to noise ratio.

Another object of the invention is to provide an improved audio filter circuit which enables either single-ended or double-ended output.

Still another object of the invention is to provide an improved audio filter circuit which enables either single-ended or double-ended output and which maintains essentially the same noise and gain characteristics independent of the output mode.

Yet another object of the invention is to provide an improved dual mode audio filter circuit having selectable gain and providing essentially the same noise and gain characteristics independent of the output mode.

In accordance with the present invention, an audio filter circuit is formed from a pair of cross-coupled, symmetric filters, each filter having a first stage comprising a single-pole, inverting low pass filter followed by a second stage comprising a two-pole, non-inverting Sallen-Key low pass filter. The circuit is readily switched between single-ended and double-ended output, while maintaining comparable noise and gain characteristics. The gain of the circuit is readily adjustable over a range of gains. The circuit also provides a relatively low output impedance (approximately 100 ohms balanced, 50 ohms unbalanced) so as to enable driving typical devices over a substantial length of cable without undue high frequency signal loss.

The input signal to the circuit is in differential form, and is applied across a first pair of single-ended operational amplifiers each having a fixed resistor, and one or more switched resistors, in the feedback loop between the output terminal of the amplifier and the inverting input thereof. The input signal is coupled to the amplifier through a DC-blocking capacitor and a series-connected gain-setting resistor. The feedback resistors, in combination with the gain-setting resistors, establish the gain of the amplifier. A compensating capacitor in the feedback loop in parallel with the gain-setting resistors prevents oscillation and reduces high frequency noise, as well as reducing slew-rate-limit-induced distortion.

The input stage maintains a relatively constant gain-bandwidth product as the gain of the circuit is switched. For example, in one embodiment in accordance with the invention, I obtained a cutoff frequency (−3 dB point) for the first stage output of 196 kHz with a gain of 2.87, resulting in a gain-bandwidth product of 562 kHz, and a cutoff frequency of 805 kHz with a gain of 0.701, resulting in a gain-bandwidth product of 564 kHz, essentially the same.

The output of each of the first-stage amplifiers is applied in a cross-coupled manner to complementary inputs of a pair of differential amplifiers ("doubly differential") of the second-stage dual Sallen-Key filter in such a manner that the outputs of the first stage are summed in-phase in one section of the filter and out-of-phase in the other. This ensures that a high signal-to-noise ratio is provided by the filter, regardless of whether the filter is used in a single-ended or a double-ended output mode. Selection of the mode is accomplished by means of a pair of relays at the output of the second-stage amplifiers. The relays are configured such that each has a series arm and a shunt arm, the relays each being energizable to connect its series arm to a corresponding output terminal for signal output as desired, and being deenergizable to connect the corresponding output terminal to ground via the shunt arm, to thereby mute the output terminal. The negative output can be grounded in single-ended mode one only a single relay and with a gain difference of 6 db.

BRIEF DESCRIPTION OF THE DRAWINGS

The foregoing and other and further advantages and objects of the invention will be more readily understood on reference to the following detailed description of the invention, when taken in conjunction with the accompanying circuit diagram which shows an implementation of the invention in accordance with an illustrative embodiment thereof.

DETAILED DESCRIPTION OF AN ILLUSTRATIVE EMBODIMENT

Figure 1:
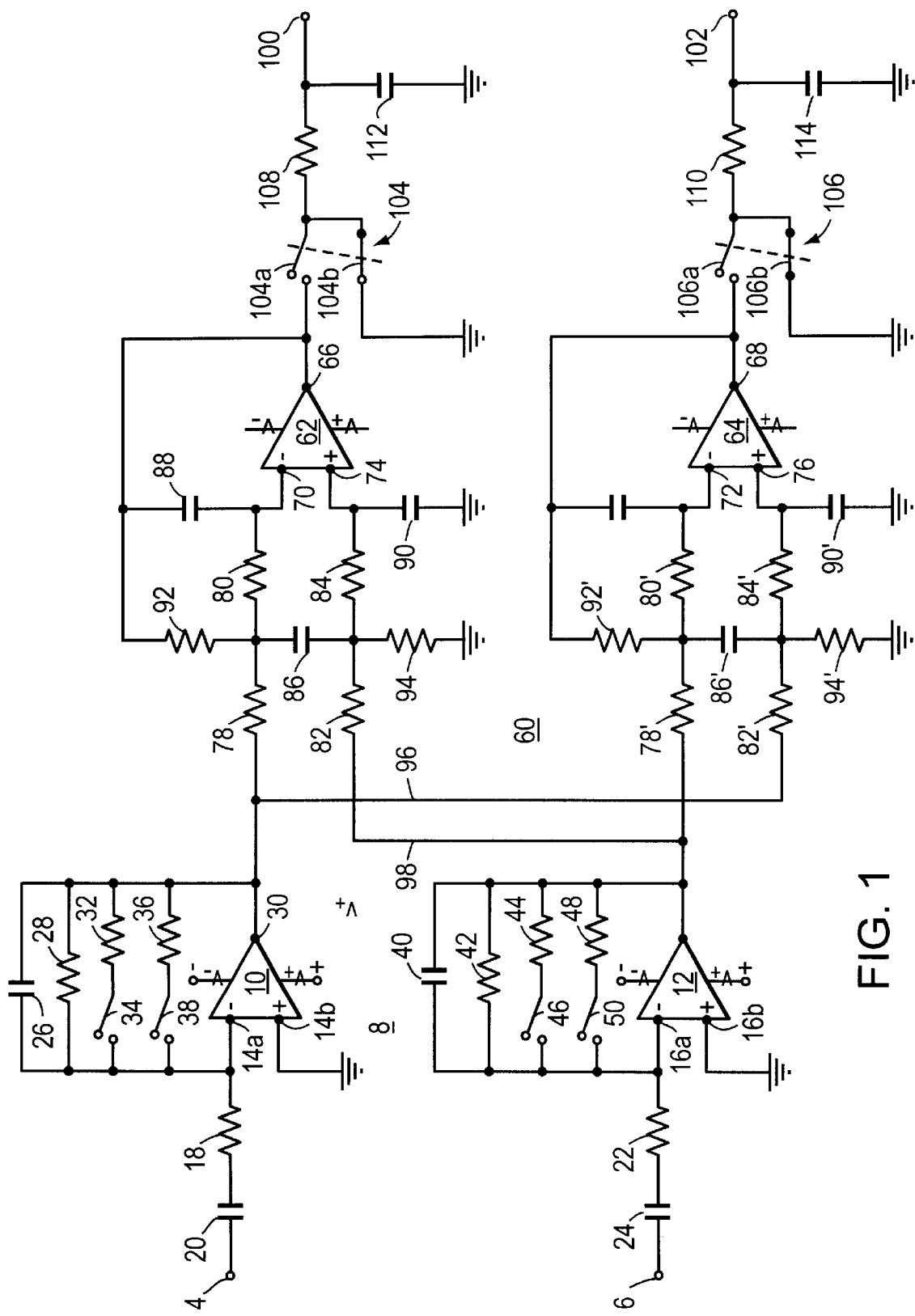

In the single FIGURE of the drawing, an exemplary embodiment of a stable, low noise, bimodal audio filter circuit in accordance with the invention is shown in detail. The FIGURE illustrates a single filter channel for processing monaural output. For stereo output, an identical filter is used. In the drawing, a differential input (e.g., from a high-frequency, switched-capacitor, DAC) is applied to input terminals 4 and 6 of the first stage 8 of the filter of the present invention. This stage is formed from first and second differential amplifiers 10 and 12 having corresponding inverting input terminals 14a and 14b, respectively, and non-inverting input terminals 16a and 16b, respectively. The latter terminals are grounded; the former are connected to receive inputs via resistor 18 and capacitor 20 (in the case of input terminal 14a) and resistor 22 and capacitor 24 ( in the case of input terminal 16a), respectively. The amplifiers are high-gain differential (i.e., having complementary inverting and non-inverting inputs, respectively) amplifiers. A capacitor 26 and a resistor 28 are connected in feedback relation between an output terminal 30 of amplifier 10 and the inverting input terminal 14a. In parallel with these are a first resistor 32 connected in series with a switch 34 and a second resistor 36 connected in series with a switch 38. A similar arrangement is provided for amplifier 12 by capacitor 40, resistor 42, resistor 44 in series with switch 46, and resistor 48 in series with switch 50.

Capacitors 20 and 24 provide DC rejection, and are selected in conjunction with resistor 18 to provide a low frequency cutoff of at most a few Hz. Capacitors 26 and 40 prevent oscillation and reduce high frequency noise, particularly at the maximum output levels. Typically, they are of the order of a few hundred picofarad.

The gain of the first stage can readily be changed by means of the switches 34, 38, 44 and 48 while maintaining essentially a constant gain-bandwidth product. In one ebodiment of the invention, the following results were achieved:

| S34 | S36 | Gain | 3-db Cutoff (kHz) | Gain-Bandwidth |
|---|---|---|---|---|
| open | open | 2.87 | 196 | 562 |
| closed | open | 1.412 | 400 | 564 |
| open | closed | 0.701 | 805 | 564 |

A second stage 60 of the filter of the present invention comprises a doubly differential low pass filter formed from differential amplifiers 62, 64 having output terminals 66, 68, respectively; inverting input terminals 70, 72, respectively; and non-inverting input terminals 74, 76, respectively. Resistors 78 and 80 connect the output of amplifier 10 to the inverting input of amplifier 62, and resistors 82 and 84 connect the output of amplifier 12 to the non-inverting input of amplifier 62. A capacitor 86 interconnects the junctions of resistors 78, 80 and 82, 84, respectively. The inverting input terminal 70 of amplifier 62 is connected to the output by a capacitor 88; the non-inverting input terminal of amplifier 62 is connected to ground by a capacitor 90. A resistor 92 also connects the output of amplifier 62 to the junction of resistors 78 and 80; a resistor 94 connects the junction of resistors 82 and 84 to ground.

The structure surrounding amplifier 64 is the same as that surrounding amplifier 62. Corresponding components in connection with amplifier 64 are indicated, in the main, by primed numbers and need not further be described.

The output of amplifier 10 is also applied to the non-inverting input of amplifier 64 via a lead 96. Similarly, the output of amplifier 12 is applied to the non-inverting input of amplifier 62 via a lead 98. The configuration thus formed is doubly differential.

The outputs of amplifiers 62 and 64 are connected to output terminals 100, 102 through switches 104, 106, respectively, resistors 108, 100, respectively, and capacitors 112,,114, respectively. The switches 104 and 106 have first series-connected normally-open arms 104a and 106a, respectively, and second normally-closed shunt-connected arms 104b and 106b, respectively. When both relays are deenergized, the output terminals 100, 102 are shunted to ground via switch arms 104b, 106b, respectively; this is the muted condition of the filter. When relay 104 is energized and relay 106 deenergized, switch arm 104b is open and the output of amplifier 62 is passed to output terminal 100 via relay arm 104a and resistor 108; in this mode, a single-ended output is provided. When relays 104 and 106 are both energized, the output of amplifier 62 is applied to output terminal 100 via relay 104a and resistor 108, while the output of amplifier 64 is applied to output terminal 102 via relay 106a and resistor 110. In this mode, a balanced output is provided.

The circuitry shown herein provides a single channel of output. For dual outputs (e.g., left and right audio outputs), the circuit of the drawing is replicated, once for each channel. In such a case, relay 104 is connected to receive the output of both amplifier 62 and its correspondent in the second channel; similarly, relay 106 is connected to receive the output of both amplifier 64 and its correspondent in the second channel.

What is claimed is:

1. A stable, bimodal, low-noise audio filter comprising:
   a first pair of differential amplifiers connected to receive an audio signal differentially applied as input thereto;
   a second pair of differential amplifiers, each connected to receive an output from each of the first pair of differential amplifiers;
   and means for switchably connecting the output of each of said second pair of amplifiers to a corresponding output terminal to thereby provide a balanced or unbalanced output dependent on the state of said switches.

2. The filter of claim 1 in which the respective outputs of each of said first pair of amplifiers are applied to complementary inputs of said second pair of amplifiers.

3. The filter of claim 2 which includes a pair of relays, each connected between an output terminal of one of said second pair of amplifiers and a corresponding output terminal of said filter, each said relay operable to define a first state in which said relay connects said output terminal of its associated amplifier to the corresponding output terminal of said filter, and a second state in which the said filter output terminal is shunted to ground.

4. The filter of claim 2 which includes first and second impedances switchably connected in negative feedback relation across a corresponding amplifier of said first pair of amplifiers, to thereby provide a variable gain for said filter when said impedances are switched into said place.

5. The filter of claim 2 which includes first and second pluralities of impedances, each plurality switchably connected in negative feedback relation across a corresponding amplifier of said first pair of amplifiers, to thereby provide a variable gain for said filter when said impedances are switched into place.

6. A stable, bimodal, low-noise audio filter having first and second channels selectably providing balanced or unbalanced outputs, each said channel comprising:
   a first pair of differential amplifiers connected to receive at a first input thereof an audio signal differentially applied as input thereto;
   a second pair of differential amplifiers, each connected to receive an output from each of said first pair of amplifiers; and
   means for switchably connecting the output of each of said second pair of amplifiers to a corresponding output terminal to thereby provide a balanced or unbalanced output, dependent on the state of said switches.

7. The filter of claim 6 in which each channel includes a pair of relays, each connected between an output terminal of one of said second pair of amplifiers and a corresponding output terminal of said channel, each said relay operable to define a first state in which said relay connects said output terminal of its associated amplifier to the corresponding output terminal of said channel, and a second state in which said channel output terminal is shunted to ground, the corresponding relays in each channel being coupled for common energization or deenergization to thereby provide balanced or unbalanced filter outputs dependent on the state of said relays.

8. The filter of claim 7 which includes first and second impedances switchably connected in negative feedback relation across a corresponding amplifier of said first pair of amplifiers in each channel, to thereby provide a variable gain for said filter when said impedances are switched into said place.

9. The filter of claim 8 in which, for each channel, the output of a first amplifier of said first stage is connected to a first input of a first amplifier of said second stage and to a complementary first input of a second amplifier of said second stage and the output of a second amplifier of said second stage is connected to a second input of a first amplifier of said second stage and to a complementary second input of a second amplifier of said second stage.

\* \* \* \* \*